United States Patent [19]

Davis et al.

[11] Patent Number: 4,771,429
[45] Date of Patent: Sep. 13, 1988

[54] CIRCUIT COMBINING FUNCTIONS OF CYCLIC REDUNDANCY CHECK CODE AND PSEUDO-RANDOM NUMBER GENERATORS

[75] Inventors: Charles L. Davis, Flower Mound; Jerry R. Sanders, Dallas; James A. Rench, Grand Prairie, all of Tex.

[73] Assignee: Abbott Laboratories, Abbott Park, Ill.

[21] Appl. No.: 908,541

[22] Filed: Sep. 18, 1986

[51] Int. Cl.$^4$ .................. G06F 11/10; H03K 3/84
[52] U.S. Cl. ................... 371/27; 364/717; 371/37
[58] Field of Search ............ 371/37, 25, 27; 364/717

[56] References Cited

U.S. PATENT DOCUMENTS

| | | | |
|---|---|---|---|
| 3,155,818 | 11/1964 | Goetz | 371/40 |
| 3,474,413 | 10/1969 | Dryden | 371/37 |
| 3,512,150 | 5/1970 | Ohnsorge | 371/37 X |
| 3,924,181 | 12/1975 | Alderson | 371/27 X |
| 3,986,168 | 10/1976 | Anderson | 371/27 |
| 4,001,779 | 1/1977 | Schiff | 371/37 |
| 4,023,026 | 5/1977 | O'Farrell | 364/717 |
| 4,165,444 | 8/1979 | Gordon | 371/37 X |
| 4,216,374 | 8/1980 | Lam et al. | 371/27 |
| 4,222,514 | 9/1980 | Bass | 371/27 |
| 4,291,386 | 9/1981 | Bass | 364/717 |
| 4,320,509 | 3/1982 | Davidson | 371/25 |
| 4,337,483 | 6/1982 | Guillou | 358/114 |
| 4,352,011 | 9/1982 | Guillou | 235/375 |
| 4,354,201 | 10/1982 | Sechet et al. | 358/122 |
| 4,493,046 | 1/1985 | Watanabe | 364/717 |
| 4,549,298 | 10/1985 | Creed et al. | 371/40 |

OTHER PUBLICATIONS

Clark & Cain, Error-Correction Coding for Digital Communications, Plenum Press, N.Y., 1981, pp. 89-90.
Shift Register with Feedback Generates White Noise, Damashek, Electronics, May 27, 1976, pp. 107-109.
The Great CRC Mystery, Ritter, Dr. Dobb's Journal, Feb. 1986, pp. 26-34.

Primary Examiner—Charles E. Atkinson
Attorney, Agent, or Firm—Dennis K. Shelton; Martin L. Katz

[57] ABSTRACT

A circuit is disclosed which combines the functions of a cyclic redundancy check code (CRCC) generator and a pseudo-random number generator in such a way that common elements are shared rather than duplicated. A 16-stage shift register and two linear feedback paths are included for the CRCC and pseudo-random number generators. A control section of the circuit controls the mode of operation of the circuit according to the state of a mode control signal. A signal on a clear line resets the shift register or initializes it with a selected value depending on the state of the mode control signal. The mode control signal also controls the input of data on a data line and the output of generated CRC and pseudo-random access codes on output lines.

9 Claims, 1 Drawing Sheet

CIRCUIT COMBINING FUNCTIONS OF CYCLIC REDUNDANCY CHECK CODE AND PSEUDO-RANDOM NUMBER GENERATORS

BACKGROUND OF THE INVENTION

1. Field of the Invention

This invention relates generally to electronic circuits for generating pseudo-random bit patterns. More particularly, the invention concerns a circuit that combines a cyclic redundancy check code generator and a pseudo-random number generator in such a way that the two generators share most of their common electronic elements.

2. Statement of Related Art

Both cyclic redundancy check code (CRCC) generator circuits and pseudo-random number generator circuits are well known individually. CRCC generator circuits have found widespread use in digital recording, satellite communications, and cable television data transmission systems to name but a few applications. See for example Creed et al. U.S. Pat. No. 4,549,298; Sechet et al. U.S. Pat. No. 4,354,201; Guillou U.S. Pat. No. 4,352,011; and Guillou U.S. Pat. No. 4,337,483. Pseudo-random number generator circuits have also found widespread use in integrated circuit testing, restricted access, cable and videotext subscription services, and a host of other applications. See for example Sechet et al. U.S. Pat. No. 4,354,201; Guillou U.S. Pat. No. 4,352,011; Davidson U.S. Pat. No. 4,320,509; Bass U.S. Pat. No. 4,291,386; Bass U.S. Pat. No. 4,222,514; and Lam et al. U.S. Pat. No. 4,216,374.

In some instances, particularly in the areas of integrated circuit testing and restricted access cable and videotext subscription services, CRCC generator and pseudo-random number generator circuits have both been used simultaneously, although not in the same circuit.

No one to my knowledge, however, has suggested combining the functions of a CRCC generator and a pseudo-random number generator in a single circuit wherein common electronic circuit elements are shared rather than duplicated as in prior art applications. Such a circuit design in discrete logic form provides cost advantages due to the decrease in the number of electronic circuit elements required. Moreover, improvements in energy consumption are obtained for the same reason. In integrated circuit form the advantages of the proposed design also include the conservation of precious substrate space which can then be used for the fabrication of additional logic elements.

Accordingly, it is an object of the invention to provide a simplified circuit design that combines the functions of a CRCC generator and a pseudo-random number generator, and wherein the two generators share common electronic components.

It is another object of the invention to provide such a circuit having means for easily and quickly controlling the mode of operation.

It is yet another object of the invention to provide such a circuit particularly adapted to generate CRC codes for ensuring accurate data transmission and reception and selected pseudo-random bit sequences for use as restricted access codes.

SUMMARY OF THE INVENTION

The foregoing objects and attendant advantages are achieved by providing a circuit combining cyclic redundancy check code and pseudo-random number generator functions. The circuit comprises a signal shifting element having a plurality of stages, a feedback section connected to the shifting element, and a control section. The feedback section operates on signals from selected stages of the signal shifting element and feeds the resulting signals back to selected preceding stages thereof. The control section selectively controls the operations of the feedback section on the signals to make the circuit operate as either a cyclic redundancy check code generator or a pseudo-random number generator.

BRIEF DESCRIPTION OF THE DRAWING

The novel features that are believed to be characteristic of the invention are set forth in the appended claims. The invention itself will be best understood by reference to the following detailed description of a circuit combining cyclic redundancy check code and pseudo-random number generator functions which constitutes the presently preferred embodiment of the invention, in conjunction with the drawing, in which:

DETAILED DESCRIPTION OF THE PRESENTLY PREFERRED EMBODIMENT

Figure 1:
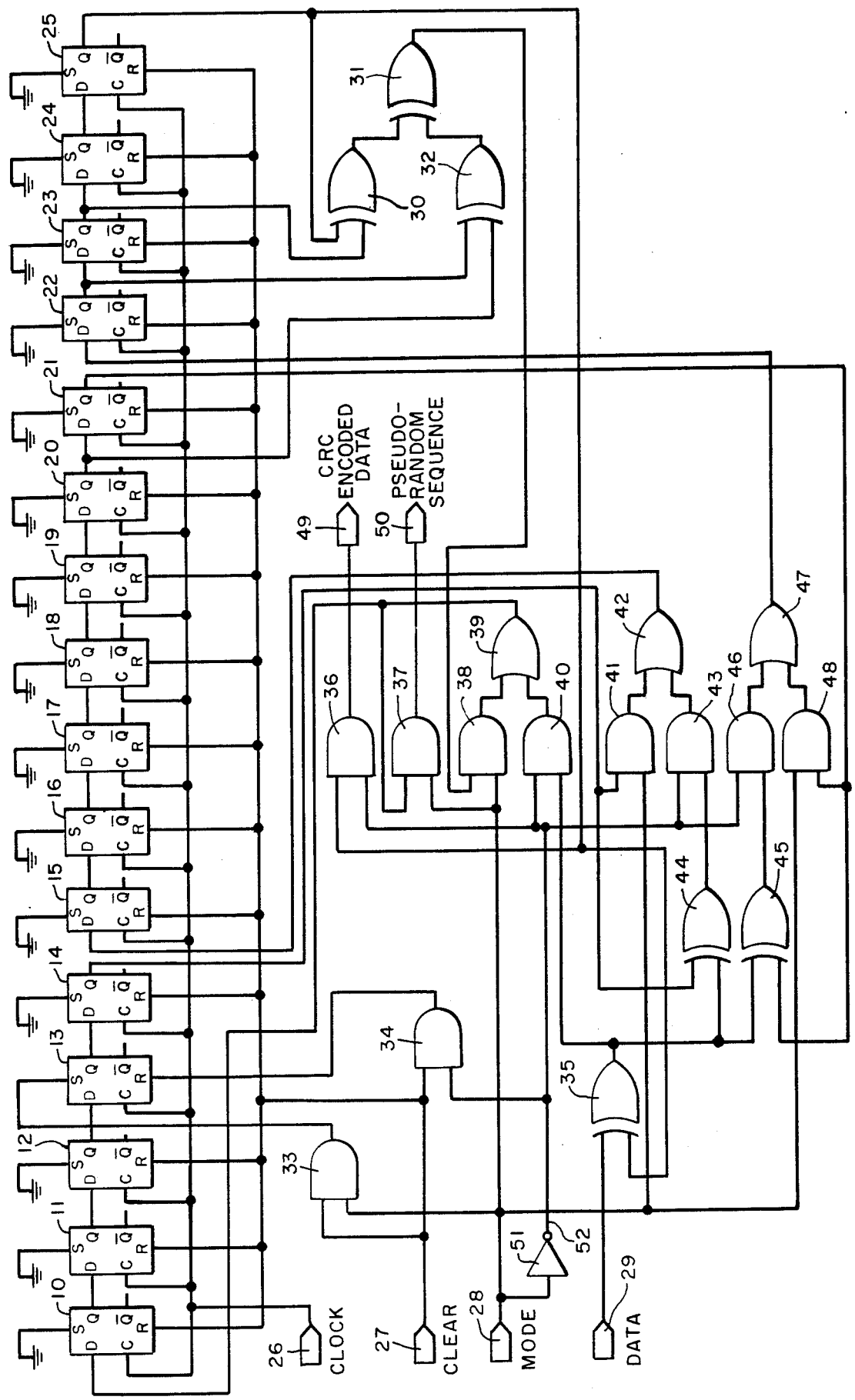
FIG.1, the sole FIGURE, is a schematic diagram illustrating the design of the presently preferred circuit combining CRCC and pseudo-random number generator functions in accordance with the invention.

With reference to FIG. 1, a circuit combining the functions of a cyclic redundancy check code (CRCC) generator and a pseudo-random number (PRN) generator constituting a presently preferred embodiment of the invention is illustrated. The presently preferred CRCC/PRN circuit generally comprises a 16-stage linear feedback shift register which is shared by the CRCC and PRN generators, a first linear feedback section for the CRCC generator, a second linear feedback section for the PRN generator, and a control section for controlling the mode of operation of the circuit.

The 16-stage shift register consists of series connected latches 10-25. Each of the latches 10-25 except latch 13 has its set terminal S connected to ground. Each of the latches 10-25 except latch 13 also has its reset terminal R connected to a clear line 27. The set S and reset R terminals of latch 13 are connected to the control section as described below. Each of the latches 10-25 has its clock terminal C connected to a clock line 26. The clock signal on line 26 is synchronized with the input rate of data bits on a data line 29. Except for latches 10, 14, 15, 21, 22 and 25, the output terminal Q of each latch is connected directly to the data input terminal D of the next latch. The data input terminal D of latch 10 is connected to outputs of first and second linear feedback sections described below. The output terminal Q of latch 14 and the data input terminal D of latch 15 are connected to an input and output respectively of the second linear feedback section described below. The output terminal Q of latch 21 and the data input terminal D of latch 22 are likewise connected to an input and output respectively of the second linear feedback section described below. The output terminal Q of latch 25 is connected to inputs of the first and second linear feedback sections described below.

The first linear feedback section in the preferred circuit implements the well-known CRC-CCITT standard. The CRC-CCITT code is a 16-bit binary polynomial of the form $x^{16}+x^{12}+x^5+1$. Although the CRC- CCITT standard is preferred for its high degree of error detection, it is understood that its implementation in the preferred circuit is merely exemplary and that many other CRC codes can also be implemented for specific applications.

Generally, the 16-bit CRC-CCITT code is generated by XOR'ing the output bit of the sixteenth stage of a sixteen stage shift register with an input data bit and feeding back the resulting bit to the input of the first stage. The resulting bit is also XOR'd with the output bit of the fifth stage and the bit resulting from that operation is input to the sixth stage. The bit resulting from the XOR operation on the output of the sixteenth stage is also XOR'd with the output bit of the twelfth stage and the resulting bit is input to the thirteenth stage.

In the presently preferred circuit specifically, the output terminal Q of latch 25 is connected to an input of an XOR gate 35. The other input of the XOR gate 35 is connected to the data input line 29. The output of the XOR gate 35 is connected to an input of an AND gate 40. The other input of the AND gate 40 is connected to the control section as described below. The output of the AND gate 40 is connected to an input of an OR gate 39. The other input of the OR gate 39 is connected to the output of an AND gate 38 comprising part of the second linear feedback section described below. The output of the OR gate 39 is connected to the data input terminal D of the latch 10 and to an input of an AND gate 37 comprising part of the second linear feedback section described below.

The output of the XOR gate 35 is also connected to inputs of XOR gates 44 and 45. The other input of XOR gate 44 is connected to the output terminal Q of latch 14. The other input of XOR gate 45 is connected to the output terminal Q of latch 21.

The output of XOR gate 44 is connected to an input of an AND gate 43. The other input of AND gate 43 is connected to the control section as described below. The output of the AND gate 43 is connected to an input of an OR gate 42. The other input of OR gate 42 is connected to the output of an AND gate 41 comprising part of the second linear feedback section described below. The output of the OR gate 42 is connected to the data input terminal D of latch 15.

The output of XOR gate 45 is connected to an input of an AND gate 46. The other input of AND gate 46 is connected to the control section as described below. The output of the AND gate 46 is connected to an input of an OR gate 47. The other input of-the OR gate 47 is connected to the output of an AND gate 48 comprising part of the second linear feedback section described below. The output of the OR gate 47 is connected to the data input terminal D of the latch 22.

The output terminal Q of the latch 25 is also connected to an input of an AND gate 36. The other input of AND gate 36 is connected to the control section as described below. The output of the AND gate 36 is a bit-serial CRC output code on line 49.

The second linear feedback section generates a pseudo-random bit pattern which circulates through the shift register. Specifically, the preferred second linear feedback section described below generates the following 64-bit pseudo-random number in the shift register:

| Bit # | Data | Bit # | Data | Bit # | Data | Bit # | Data |
| --- | --- | --- | --- | --- | --- | --- | --- |
| 0 | 0 | 1 | 0 | 2 | 0 | 3 | 0 |
| 4 | 0 | 5 | 0 | 6 | 0 | 7 | 1 |

-continued

| Bit # | Data | Bit # | Data | Bit # | Data | Bit # | Data |
| --- | --- | --- | --- | --- | --- | --- | --- |
| 8 | 0 | 9 | 1 | 10 | 1 | 11 | 0 |
| 12 | 1 | 13 | 0 | 14 | 0 | 15 | 0 |
| 16 | 0 | 17 | 0 | 18 | 1 | 19 | 0 |
| 20 | 0 | 21 | 0 | 22 | 1 | 23 | 0 |
| 24 | 1 | 25 | 0 | 26 | 0 | 27 | 0 |
| 28 | 1 | 29 | 1 | 30 | 0 | 31 | 1 |
| 32 | 1 | 33 | 1 | 34 | 1 | 35 | 0 |
| 36 | 1 | 37 | 1 | 38 | 0 | 39 | 1 |
| 40 | 0 | 41 | 1 | 42 | 1 | 43 | 0 |
| 44 | 1 | 45 | 0 | 46 | 0 | 47 | 0 |
| 48 | 1 | 49 | 0 | 50 | 0 | 51 | 1 |
| 52 | 1 | 53 | 1 | 54 | 1 | 55 | 0 |
| 56 | 1 | 57 | 0 | 58 | 0 | 59 | 1 |
| 60 | 1 | 61 | 1 | 62 | 0 | 63 | 1 |

The particular pseudo-random number is selected by presetting a value in the shift register as described below. The selected pseudo-random number thus produced is very useful as an access code. Of course, it is understood that the circuit may also find use in applications other than access code generation. In such cases, the shift register may or may not be initialized with a predetermined value. It is also understood that the bit pattern set forth above is merely exemplary and that many other pseudo-random numbers can be generated merely by changing the initial value in the shift register or by altering the structure of the second linear feedback section, which will now be described.

In the presently preferred circuit specifically, the output terminals Q of the latches 23 and 25 are connected to inputs of an XOR gate 30. The output terminals Q of the latches 20 and 22 are connected to the inputs of an XOR gate 32. The outputs of the XOR gates 30 and 32 are connected to inputs of an XOR gate 31. Thus, the bit output by the XOR gate 31 comprises the XOR function of the bits on the outputs of the eleventh, thirteenth, fourteenth and sixteenth stages of the shift register.

The output of the XOR gate 31 is connected to an input of the AND gate 38. The other input of the AND gate 38 is connected to the control section as described below. The output of the AND gate 38 is connected to an input of the OR gate 39, the output of which is connected to the data input terminal D of the latch 10 as described above.

The output of the OR gate 39 is also connected to an input of an AND gate 37. The other input of AND gate 37 is connected to the control section as described below. The output of the AND gate 37 on line 50 is a bit-serial pseudo-random access code.

The AND gates 41 and 48 are not part of the feedback path between the output terminal Q of latch 25 and the data input terminal D of latch 10. However, they cooperate with the operation of the second feedback section under control of the control section and for convenience therefore are described with the second feedback section. The AND gate 41 has one input connected to the output terminal Q of the latch 14 and the other input connected to the control section. The AND gate 48 has one input connected to the output terminal Q of the latch 21 and the other input connected to the control section. The output of the AND gate 41 is connected to an input of the OR gate 42 and the output of the AND gate 48 is connected to an input of the OR gate 47 as described above.

The control section controls the mode of operation of the CRCC/PRN circuit and clearing and presetting of the shift register. A mode control line 28 is connected to inputs of AND gates 33, 37, 38, 41, and 48, and to the input of an inverter 51. The output of the inverter 51 is connected by an inverted mode line 52 to inputs of AND gates 34, 36, 40, 43, and 46. The other inputs of AND gates 36, 37, 38, 40, 41, 43, 46, and 48 have been described above. A clear line 27 is the other input of AND gates 33 and 34. The output of AND gate 33 is connected to the set terminal S of the latch 13. The output of AND gate 34 is connected to the reset terminal R of the latch 13.

In operation, the mode of operation of the CRCC/PRN circuit is first set by sending a signal on the mode control line 28. A logic high signal on the mode control line 28 and corresponding logic low signal on the inverted mode control line 52 causes the circuit to function in the pseudo-random generator mode. Conversely, a logic low level signal on the mode control line 28 and corresponding logic high signal on the inverted mode control line 52 operates the circuit in the CRCC generator mode. The signal on the mode control line 28 must be maintained until operation of the circuit in the selected mode is completed. This may be accomplished by latching the signal using a conventional S-R latch (not shown) for example.

After the operating mode is set, a high level logic signal is placed on the clear line 27. In the pseudo-random generator mode, this results in the output of AND gate 33 going high to preset the latch 13. The output of the AND gate 34 which is connected to the reset terminal R of the latch 13 is held low by the low signal on the inverted mode control line 52. The high signal on the clear line 27 resets the rest of the latches 10–12 and 14–25. Thus, a high signal on the clear line 27 in the pseudo-random generator mode presets the shift register to 0008 hexidecimal.

In the CRCC generator mode, the low signal on the mode control line 28 maintains the output of the AND gate 33 connected to the set terminal S of the latch 13 low. The high signal on the inverted mode control line 52 and the high signal on the clear line 27 cause the output of the AND gate 34 which is connected to the reset terminal R of the latch 13 to also go high. Thus, in the CRCC generator mode all the latches 10–25 are reset by a high signal on the clear line 27.

After the mode is set and the shift register is cleared or preset, a clock signal is put on the clock line 26. Simultaneously and synchronously therewith, data bits are clocked into the circuit on data input line 29 at the same rate. In the pseudo-random number generator mode, the preset bit in latch 13 is sequentially clocked through the shift register. At the output terminal Q of latch 14, it propagates through the AND gate 41 and OR gate 42 before being input to the data input terminal D of latch 15. The output of the AND gate 43 which is connected to an input of the OR gate 42 is held low by the low signal on the inverted mode control line 52 and does not effect the output of the OR gate 42. Similarly at the output terminal Q of latch 21, the output bit propagates through AND gate 48 and OR gate 47 before being input to the data input terminal D of the latch 22. The output of AND gate 46 is held low by the low signal on the inverted mode control line and therefore does not effect the output of the OR gate 47.

During each clock cycle, the bits at the output terminals Q of latches 20, 22, 23, and 25 are XOR'd by the XOR gates 30–32 and the resulting bit is fed back through the AND gate 38 and OR gate 39 to the data input terminal D of the latch 10 to complete the pseudo-random number generator linear feedback loop. The output of the AND gate 40 which is connected to an input of the OR gate 39 is held low by the low signal on the inverted mode control line 52 and therefore does not effect the output of the OR gate 39. The bit output by the OR gate 39 also propagates through the AND gate 37, the output of which is the serial 64-bit pseudo-random access code set out in tabular format above.

In the CRCC generator mode, the shift register is initially clear. As data bits are clocked in on the data line 29, they are XOR'd with the bit on the output terminal Q of latch 25 by XOR gate 35. The resulting bit propagates through the AND gate 40 and OR gate 39 to the data input terminal D of the latch 10 to complete the CRCC generator linear feedback loop. The output of the AND gate 38 which is connected to an input of the OR gate 39 is held low by the low signal on the mode control line 28 and therefore does not effect the output of the OR gate 39. The bits output from terminal Q of the latch 25 also propagate through the AND gate 36 in serial form and comprise the generated 16-bit serial CRC code on line 49.

In the shift register, the bits in each stage propagate sequentially to the next stage with each clock cycle. The bit on the output terminal Q of latch 14 is XOR'd with the bit on the output of the XOR gate 35 by XOR gate 44. The resulting bit propagates through the AND gate 43 and the OR gate 42 before being input to the data input terminal D of latch 15. The output of the AND gate 41 which is connected to an input of the OR gate 42 is held low by the low signal on the mode control line 28 and therefore does not effect the output of the OR gate 42. Likewise, the bit on the output terminal Q of latch 21 is XOR'd with the bit on the output of the XOR gate 35 by the XOR gate 45. The resulting bit propagates through the AND gate 46 and OR gate 47 to the data input terminal D of the latch 22. The output of the AND gate 48 which is connected to an input of the OR gate 47 is held low by the low signal on the mode control line 28 and therefore does not effect the output of the OR gate 47.

What have been described are various aspects of a circuit combining functions of a pseudo-random number generator and a cyclic redundancy check code generator which circuit constitutes a presently preferred embodiment of the invention. It is understood that the foregoing description and accompanying illustration are merely exemplary and in no way limit the scope of the invention, which is defined by the appended claims. Various changes and modifications to the preferred embodiment will be apparent to those skilled in the art. Such changes and modifications may include but are not limited to changes in the length and type of the shift register, changes in the structure and logic of the feedback paths, changes in the shift register preset value, and the like. Such changes and modifications can be made without departing from the spirit and scope of the invention. Accordingly, it is intended that all such changes and modifications and other equivalents be covered by the appended claims.

We claim:

1. A logic circuit for selectively performing both cyclic redundancy check code and pseudo-random sequence generator functions, comprising:

shifting means having a plurality of stages for sequentially shifting a plurality of signals;

feedback means connected to said shifting means, comprising:
  means for selectively performing one of two sets of predetermined logic operations corresponding to pseudo-random sequence generator operations and cyclic redundancy check code generator operations respectively on signals from preselected stages of said shifting means; and
  means for feeding back the signals resulting from the selected operations to preselected preceding stages of said shifting means; and
control means connected to said feedback means and responsive to at least one mode selection signal for causing said feedback means to perform a selected one of said sets of logic operations on said signals so that said circuit selectively functions as both a cyclic redundancy check code generator and a pseudo-random sequence generator.

2. The logic circuit defined in claim 1 including data input means connected to said feedback means and responsive to said mode selection signal for providing input data to said feedback means when cyclic redundancy check code generator operation is selected.

3. The logic circuit defined in claim 1 including means connected to said shifting means and responsive to said mode selection signal and at least one clear signal for clearing said shifting means when cyclic redundancy check code generator operation is selected and for initializing said shifting means with a preselected value when pseudo-random generator operation is selected.

4. The logic circuit defined in claim 1 wherein said feedback means includes means logically interposed between at least one preselected stage of said shifting means and the next succeeding stage thereof responsive to said mode selection signal to perform a predetermined logical operation on the signal shifted from said at least one preselected stage to said next succeeding stage when cyclic redundancy check code generator operation is selected and otherwise to pass the signal to said next succeeding stage unchanged.

5. A logic circuit for selectively performing both cyclic redundancy check code and pseudo-random sequence generator functions, comprising:
  shift register means having a plurality of stages for sequentially shifting a plurality of signals;
  first feedback means adapted to receive data input signals and connected to said shift register means, comprising:
    means for performing a first set of predetermined logic operations on said data input signals and signals from at least one preselected stage of said shift register means; and
    means for feeding back the signals resulting from said first set of logic operations to at least one preselected preceding stage of said shift register means to generate a cyclic redundancy check code;
  second feedback means connected to said shift register means, comprising:
    means for performing a second set of predetermined logic operations on signals from at least one preselected stage of said shift register means; and
    means for feeding back the signals resulting from said second set of logic operations to at least one preselected preceding stage of said shift register means to generate a pseudo-random sequence; and
  control means connected to said first and second feedback means and responsive to at least one mode selection signal for selectively enabling and disabling said first and second feedback means to perform said first and second sets of logic operations thereby causing said logic circuit to selectively function as both a cyclic redundancy check code generator and a pseudo-random sequence generator.

6. The logic circuit defined in claim 5 including means connected to said shift register means and responsive to said mode selection signal and a clear signal for clearing said shift register means when cyclic redundancy check code generator operation is selected and for initializing said shift register means with a preselected value when pseudo-random generator operation is selected.

7. The logic circuit defined in claim 5 including means logically interposed between at least one preselected stage of said shift register means and the next succeeding stage thereof responsive to said mode selection signal to perform a predetermined logic operation on the signal shifting from said at least one preselected stage to said next succeeding stage when cyclic redundancy check code generator operation is selected and otherwise to pass the signal to said next succeeding stage unchanged.

8. A logic circuit for selectively performing both cyclic redundancy check code and pseudo-random sequence generator functions, comprising:
  shift register means having a plurality of stages for shifting a plurality of signals;
  feedback means adapted to receive data input signals and connected to said shift register means, comprising:
    means for selectively performing one of two sets of predetermined logic operations corresponding to pseudo-random sequence generator and cyclic redundancy check code generator operations respectively on said data input signals and signals from at least one preselected stage of said shift register means; and
    means for feeding back the signals resulting from the selected set of operations to at least one preselected preceding stage of said shift register means;
  control means connected to said feedback means and responsive to a mode selection signal for causing said feedback means to perform a selected one of said sets of logic operations so that said shift register means selectively generates both a cyclic redundancy check code and a pseudo-random sequence;
  means responsive to said mode selection signal logically interposed bewteen at least one preselected stage and the next succeeding stage of said shift register means for performing a predetermined logic operation on the signals shifted from said at least one preselected stage to said next succeeding stage when cyclic redundancy check code generator operation is selected and otherwise passing the signals to said next succeeding stage unchanged;
  data input means connected to said feedback means and responsive to said mode selection signal for providing input data signals to said feedback means when cyclic redundancy check code generator operation is selected;

data output means connected to said feedback means and adapted to receive data signals and signals from said shift register means, said output means responsive to said mode selection signal for selectively outputting cyclic redundancy check code encoded data when cyclic redundancy check code generator operation is selected and a pseudo-random sequence when pseudo-random sequence generator operation is selected; and means connected to said shift register means and responsive to a clear signal and to said mode selection signal for selectively clearing said shift register means when cyclic redundancy check code generator operation is selected and for presetting said shift register means with a preselected value when pseudo-random sequence generator operation is selected.

9. A logic circuit for selectively generating a plurality of preselected pseudo-random sequences, comprising:

shift register means having a plurality of stages for shifting a plurality of signals;

feedback means connected to said shift register means, comprising:

means for selectively performing one of a plurality of predetermined sets of logic operations corresponding to said plurality of preselected pseudo-random sequences on signals from at least one preselected stage of said shift register means; and means for feeding back the signals resulting from the selected set of operations to at least one preselected preceding stage of said shift register means to generate a corresponding one of said plurality of preselected pseudo-random sequences in said shift register means; and control means connected to said feedback means and responsive to mode selection signals identifying one of said plurality of sets of logic operations for causing said feedback means to perform the identified set of operations on said signals to generate a selected one of said plurality of preselected pseudo-random sequences in said shift register means.

* * * * *